(12) United States Patent
Hui et al.

(10) Patent No.: US 11,159,179 B2
(45) Date of Patent: Oct. 26, 2021

(54) ENHANCED INFORMATION SEQUENCES FOR POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/633,479

(22) PCT Filed: Jul. 25, 2018

(86) PCT No.: PCT/IB2018/055571
§ 371 (c)(1),
(2) Date: Jan. 23, 2020

(87) PCT Pub. No.: WO2019/021225
PCT Pub. Date: Jan. 31, 2019

(65) Prior Publication Data
US 2020/0235754 A1 Jul. 23, 2020

Related U.S. Application Data

(60) Provisional application No. 62/537,134, filed on Jul. 26, 2017, provisional application No. 62/538,483, filed on Jul. 28, 2017.

(51) Int. Cl.
*H03M 13/13* (2006.01)
*H04L 1/00* (2006.01)

(52) U.S. Cl.
CPC .......... *H03M 13/13* (2013.01); *H04L 1/0041* (2013.01); *H04L 1/0057* (2013.01)

(58) Field of Classification Search
CPC ..... H03M 13/13; H04L 1/0041; H04L 1/0057
See application file for complete search history.

(56) References Cited

U.S. PATENT DOCUMENTS

| | | | |
|---|---|---|---|
| 2014/0019820 A1* | 1/2014 | Vardy | .................. H03M 13/13 714/752 |
| 2017/0047947 A1 | 2/2017 | Hong et al. | |

(Continued)

FOREIGN PATENT DOCUMENTS

| | | |
|---|---|---|
| CN | 107592181 A1 | 1/2018 |
| WO | 2017 106246 A2 | 6/2017 |

OTHER PUBLICATIONS

Channel Polarization: A Method for Constructing Capacity-Achieving Codes for Symmetric Binary-Input Memoryless Channels by Erdal Arikan; IEEE Transactions on Information Theory, vol. 55, No. 7—Jul. 2009.

(Continued)

*Primary Examiner* — Kyle Vallecillo
(74) *Attorney, Agent, or Firm* — Baker Botts, LLP

(57) ABSTRACT

According to some embodiments, a method of operation of a transmit node in a wireless communication system comprises performing polar encoding of a set of K information bits to thereby generate a set of polar-encoded information bits. The K information bits are mapped to the first K bit locations in an information sequence $S_N$. The information sequence $S_N$ is a ranked sequence of N information bit locations among a plurality of input bits for the polar encoding where N is equivalent to a code length. A size of the information sequence $S_N$ is greater than or equal to K. The information sequence $S_N$ is optimized for the specific value of the code length (N). The method may further comprise transmitting the set of polar-encoded information bits.

5 Claims, 8 Drawing Sheets

PERFORM POLAR ENCODING OF A SET OF K INFORMATION BITS TO THEREBY GENERATE A SET OF POLAR-ENCODED INFORMATION BITS, WHERE:
- THE K INFORMATION BITS ARE MAPPED TO THE FIRST K BIT LOCATIONS IN AN INFORMATION SEQUENCE $S_N$;
- THE INFORMATION SEQUENCE HAS A SIZE $N \geq K$ WHERE $N$ IS A CODE LENGTH FOR POLAR ENCODING, AND
- THE INFORMATION SEQUENCE $S_N$ IS OPTIMIZED FOR THE SPECIFIC CODE LENGTH $N$

100

TRANSMIT THE POLAR-ENCODED INFORMATION BITS
102

(56) References Cited

U.S. PATENT DOCUMENTS

| | | | |
|---|---|---|---|
| 2018/0191465 A1* | 7/2018 | Saber | H04J 13/10 |
| 2018/0278268 A1* | 9/2018 | Jeong | H04L 1/0043 |
| 2019/0260503 A1* | 8/2019 | Zhang | H04L 1/0013 |
| 2019/0349220 A1* | 11/2019 | Chen | H04L 25/03178 |
| 2020/0028619 A1* | 1/2020 | Maevskii | H04L 1/0013 |
| 2020/0177309 A1* | 6/2020 | Jang | H04L 1/0057 |

OTHER PUBLICATIONS

List Decoding of Polar Codes by Ido Tal and Alexander Vardy; 2011 IEEE International Symposium on Information Theory Proceedings—2011.

3GPP TSG RAN WG1 Meeting #86; Gothenburg, Sweden; Source: Huawei, HiSilicon; Title: Polar code design and rate matching (R1-167209)—Aug. 22-26, 2016.

3GPP TSG RAN WG1 Meeting #88bis; Spokane, WA; Source: Samsung; Title: Design of rate-matching polar code (R1-1705424)—Apr. 3-7, 2017.

3GPP TSG RAN WG1 Meeting #88bis; Spokane, WA; Source: Samsung; Title: Design of rate-matching polar code (R1-1706814)—Apr. 3-7, 2017.

3GPP TSG-RAN WG1 #90; Prague, Czech Republic; Source: Qualcomm Incorporated; Title: Sequence construction of Polar codes for control channel (R1-1713468)—Aug. 21-25, 2017.

PCT International Search Report for International application No. PCT/IB2018/055571—dated Nov. 6, 2018.

A Semi-Parallel Successive-Cancellation Decoder for Polar Codes by Camille Leroux et al.; IEEE Transactions on Signal Processing, vol. 61, No. 2—Jan. 15, 2013.

PCT Written Opinion of the International Searching Authority for International application No. PCT/IB2018/055571—dated Nov. 6, 2018.

\* cited by examiner

Example of polar code structure with N = 8

Polar code encoder with N = 8

ENHANCED INFORMATION SEQUENCES FOR POLAR CODES

PRIORITY

This nonprovisional application is a U.S. National Stage Filing under 35 U.S.C. § 371 of International Patent Application Serial No. PCT/IB2018/055571 filed Jul. 25, 2018 and entitled "Enhanced Information Sequences for Polar Codes" which claims priority to U.S. Provisional Patent Applications No. 62/537,134 filed Jul. 26, 2017 and 62/538,483 filed Jul. 28, 2017 both of which are hereby incorporated by reference in their entirety.

TECHNICAL FIELD

Particular embodiments are directed to wireless communications and, more particularly, to enhanced information sequences for polar codes.

INTRODUCTION

Polar codes, proposed by E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, are a class of constructive coding schemes that achieve the symmetric capacity of the binary-input discrete memoryless channels under a low-complexity Successive Cancellation (SC) decoder. The finite-length performance of polar codes under SC, however, is not competitive compared to other modern channel coding schemes such as Low-Density Parity-Check (LDPC) codes and Turbo codes. An SC List (SCL) decoder is proposed in I. Tal and A. Vardy, "List Decoding of polar codes," Proceedings of IEEE Symp. Inf. Theory, pp. 1-5, 2011, that approaches the performance of optimal Maximum-Likelihood (ML) decoder. By concatenating a simple Cyclic Redundancy Check (CRC) coding, the performance of a concatenated polar code is competitive with that of well-optimized LDPC and Turbo codes. As a result, polar codes are being considered as a candidate for future Fifth Generation (5G) wireless communication systems.

Polar coding transforms a pair of identical binary-input channels into two distinct channels of different qualities, one better and one worse than the original binary-input channel. Repeating such a pair-wise polarizing operation on a set of $N=2^n$ independent uses of a binary-input channel results in a set of $2^n$ "bit-channels" of varying qualities. Some of the bit channels are nearly perfect (i.e., error free) while the rest of them are nearly useless (i.e., totally noisy). Polar coding uses the nearly perfect channel to transmit data to the receiver and sets the input to the useless channels to have fixed or frozen values (e.g., 0) known to the receiver. For this reason, the input bits to the nearly useless and the nearly perfect channel are commonly referred to as frozen bits and non frozen (or information) bits, respectively. Only the non-frozen bits are used to carry data in a polar code. Loading the data into the proper information bit locations has direct impact on the performance of a polar code. The set of information bit locations is commonly referred to as an information set. An illustration of the structure of a length-8 polar code is illustrated in FIG. 1.

In general, the set of information bit locations varies with the number of channel uses, or equivalently the code length, N, as well as the number of data bits, or equivalently the number of information bit locations, K. However, with the commonly used Additive White Gaussian Noise (AWGN) channel model, for any code length N, if $K_1 < K_2$, then the information set $A_2$ with $K_1$ information bit locations is always a (proper) subset of the information set $A_2$ with $K_2$ information bit locations. As a result, with an AWGN channel, for any given code length N, the information sets for all possible number of information bit locations, K, may be specified by a ranking sequence $S_N$ of bit location indices of length N so that the first K indices in $S_N$ is the set of information bit locations if there are K data bits, for any $K \in \{1, 2, \ldots, N\}$. Such a ranking sequence $S_N$ is referred to as the information sequence, from which the locations of bit-channels for carrying any number of data bits K can be derived.

FIG. 2 illustrates the labeling of the intermediate information bits $s_{l,i}$, where $l \in \{0, 1, \ldots, n\}$ and $i \in \{0, 1, \ldots, N-1\}$ during polar encoding with $N=8$. The intermediate information bits are related by the following equation:

$$s_{l+1,i} = s_{l,i} \oplus s_{l,i+2^l}, \text{ for}$$

$$i \in \left\{ j \in \{0, 1, \ldots, N-1\}: \mod\left(\left\lfloor \frac{j}{2^l} \right\rfloor, 2\right) = 0 \right\} \text{ and}$$

$$l \in \{0, 1, \ldots, n-1\}, \text{ and}$$

$$s_{l+1,i+2^l} = s_{l,i+2^l}, \text{ for}$$

$$i \in \left\{ j \in \{0, 1, \ldots, N-1\}: \mod\left(\left\lfloor \frac{j}{2^l} \right\rfloor, 2\right) = 0 \right\} \text{ and}$$

$$l \in \{0, 1, \ldots, n-1\}$$

where $s_{0,i} \equiv u_i$ are the information bits and $s_{n,i} \equiv x_i$ are the code bits for $i \in \{0, 1, \ldots, N-1\}$.

SUMMARY

A main design issue of polar coding is to identify the information sequence from which the locations of bit-channels for carrying K data bits can be obtained for a given code length N. In Huawei, HiSilicon, "Polar code design and rate matching," 3GPP contribution R1-167209, September 2016, it is proposed that such an information sequence can be obtained by assigning a weight for each bit channel indexed by j based on the following polarization weight function:

$$W(j) = \sum_{i=0}^{n-1} b_i \beta^i$$

where $\beta = 2^{1/4}$ and $j = \sum_{i=0}^{n-1} b_i 2^i$ is the binary expansion of the bit-channel index j. The information sequence is obtained simply by sorting values of W(i) for $i \in \{0, 1, 2, \ldots, 2^n\}$. This information sequence is referred to as the Polarization Weight (PW) sequence.

One problem with the PW sequence is that it imposes an artificial relationship among the relative reliabilities of different bit channels as dictated by the PW function. Moreover, the value of the weight β is derived assuming an SC decoder instead of an SCL decoder, which is more commonly used in practice.

In this disclosure, information sequences that are numerically optimized for some specific code length N are presented. The optimization accounts for the performance of SCL decoders of different list sizes at different operating levels of Block Error Rate (BLER) (e.g., BLER=1% or 0.1%).

According to some embodiments, a method of operation of a transmit node in a wireless communication system comprises performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise transmitting the set of polar-encoded information bits.

According to some embodiments, a transmit node comprises a polar encoder operable to perform polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The transmit node may further comprises a transmitter operable to transmit the set of polar-encoded information bits.

According to some embodiments, a method of operation of a receive node in a wireless communication system comprises performing polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise receiving the set of polar-encoded information bits.

According to some embodiments, a receive node comprises a polar decoder operable to perform polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The receive node may further comprise a receiver operable to receive the set of polar-encoded information bits.

Also disclosed is a computer program product. The computer program product comprises instructions stored on non-transient computer-readable media which, when executed by a processor, perform the step of performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

Another computer program product comprises instructions stored on non-transient computer-readable media which, when executed by a processor, perform the step of performing polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

BRIEF DESCRIPTION OF THE DRAWINGS

The accompanying drawing figures, incorporated in and forming a part of this specification, illustrate several aspects of the disclosure, and together with the description form a more complete understanding of the embodiments and their features and advantages.

DETAILED DESCRIPTION

Figure 1:
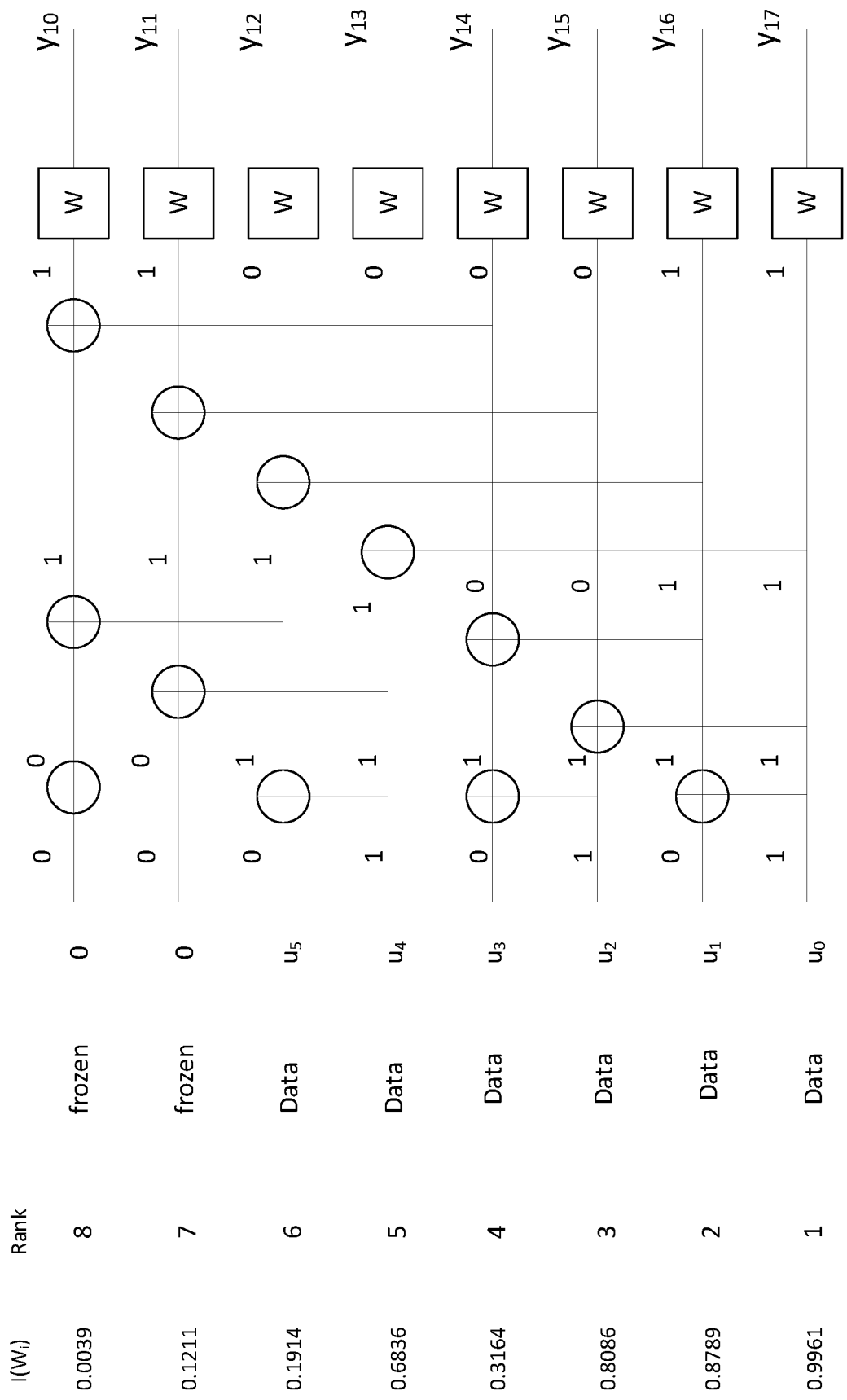
FIG. 1 illustrates an example of a polar code structure with N=8.
Figure 2:
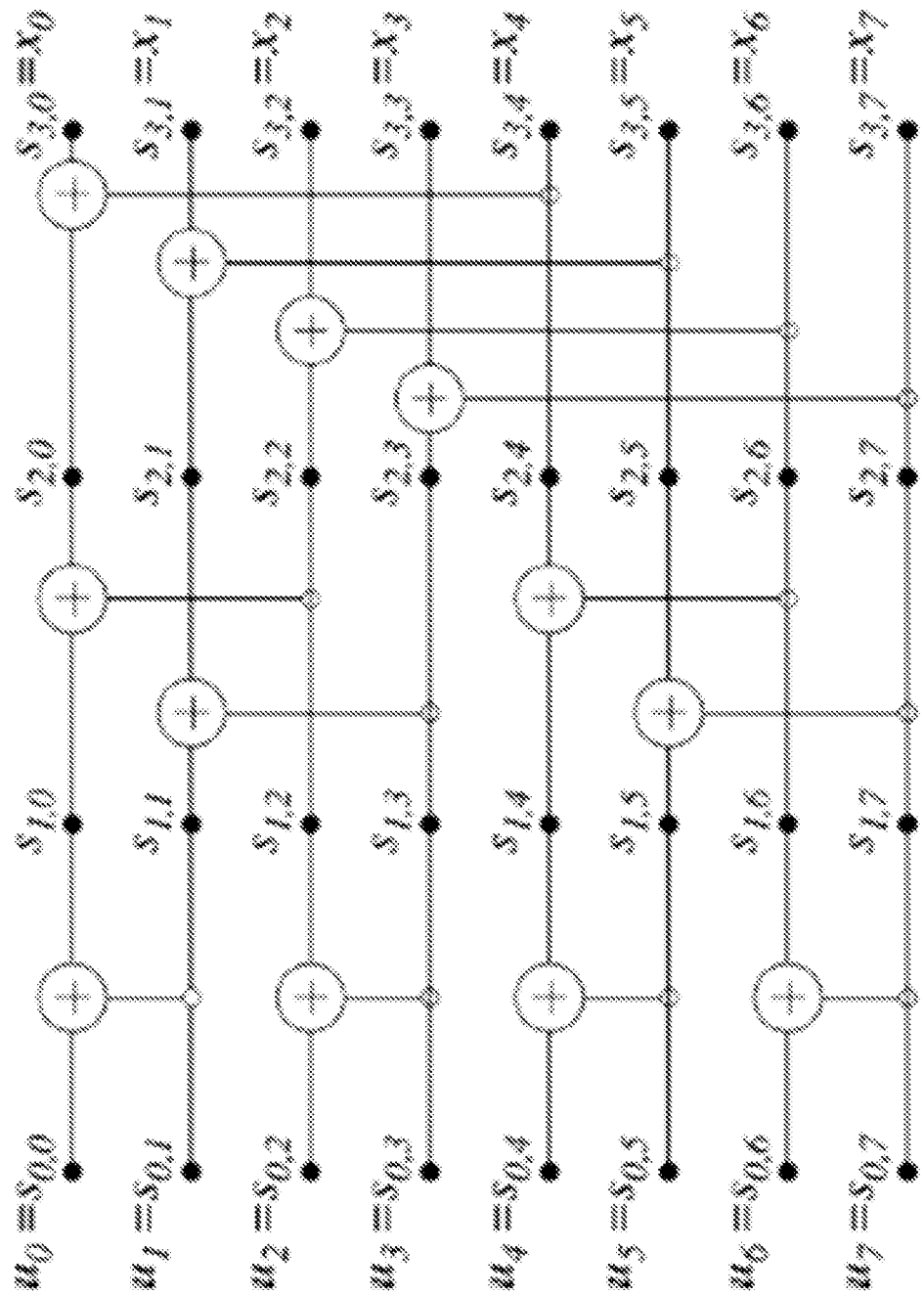
FIG. 2 illustrates labelling of intermediate bits in a polar code encoder with N=8.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) 5G NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

Systems and methods are disclosed herein relating to polar codes and the use thereof in a wireless communications system.

In this disclosure, information sequences that are numerically optimized for some specific code length N are presented. The optimization is done in such a way that accounts for the performance of SCL decoders of different list sizes at different operating levels of BLER (e.g., BLER=1% or 0.1%).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

Listed below are length-512 sequences that perform well with a SCL decoder and a SC decoder in practice. Note that it should be clear to those skilled in the art that a subsequence (or part) of each of these sequences may be extracted and used in a SCL decoder to perform polar decoding while discarding the rest of the sequence.

a) $S_{512}^1$=[511 510 509 507 503 495 508 479 506 505 502 447 501 494 499 493 383 478 491 477 504 487 475 446 255 500 445 471 498 443 492 382 497 463 490 439 381 476 489 486 379 431 474 485 254 375 473 444 470 253 483 415 442 469 367 251 496 462 441 467 438 380 461 247 351 488 437 378 459 430 239 435 484 377 429 374 472 455 319 252 482 414 373 427 223 468 366 481 250 413 371 440 423 365 466 249 411 460 465 246 436 350 363 458 191 245 407 349 238 434 376 359 457 243 428 454 347 237 318 433 399 127 372 426 453 222 317 235 343 480 412 425 370 221 451 422 315 364 248 231 410 369 335 219 421 190 464 362 311 409 244 406 189 348 419 361 215 358 456 242 405 303 187 346 236 432 398 357 126 241 207 403 452 345 316 234 397 183 342 125 355 287 424 220 450 233 314 341 395 230 123 368 175 334 449 218 420 313 339 229 310 408 391 333 119 217 188 418 360 214 309 227 159 111 331 302 186 213 404 307 417 206 301 356 185 240 327 211 182 124 402 344 95 205 286 396 299 354 181 401 122 232 285 340 203 174 394 353 295 179 121 312 63 118 173 283 228 338 393 448 199 390 332 216 158 117 337 308 171 226 279 389 110 330 157 212 115 225 306 416 167 109 387 329 300 184 271 326 155 210 305 94 204 107 298 325 209 180 400 151 93 284 202 297 352 103 323 294 178 120 91 62 201 172 282 392 143 198 293 177 61 116 281 336 170 87 197 278 388 291 156 59 114 169 224 277 195 166 108 386 328 79 270 154 113 304 55 165 275 385 106 269 324 153 208 150 92 163 105 296 47 102 267 322 149 90 200 142 101 321 292 176 263 147 89 60 280 31 86 141 196 99 290 58 168 85 276 139 194 289 78 57 112 83 54 193 164 274 384 135 77 268 152 53 273 162 104 75 46 266 148 51 161 45 100 265 320 71 262 146 88 30 140 43 98 261 145 29 84 138 97 288 39 259 56 27 82 137 192 134 76 81 52 272 23 133 74 50 160 131 73 44 264 15 70 49 42 69 260 144 28 41 96 67 38 258 26 136 37 257 25 80 22 132 35 21 130 72 14 48 19 129 13 68 40 11 66 65 36 256 7 24 34 20 33 18 128 12 17 10 9 64 6 5 32 3 16 8 4 2 1 0];

b) $S_{512}^2$=[511 510 509 507 503 495 508 479 506 505 502 447 501 494 499 493 383 478 491 477 504 487 475 446 255 500 445 471 498 443 492 382 497 463 490 439 381 476 489 486 379 431 474 485 254 375 473 444 470 253 483 415 442 469 367 251 496 462 441 467 438 380 461 247 351 488 437 378 459 430 239 435 484 377 429 374 472 455 319 252 482 414 373 427 223 468 366 481 250 413 371 440 423 365 466 249 411 460 465 246 436 350 363 458 191 245 407 349 238 434 376 359 457 243 428 454 347 237 318 433 399 127 372 426 453 222 317 235 343 480 412 425 370 221 451 422 315 364 248 231 410 369 335 219 421 190 464 362 311 409 244 406 189 348 419 361 215 358 456 242 405 303 126 346 187 432 398 357 236 241 207 403 452 345 316 175 397 234 342 125 355 287 424 220 450 183 314 341 395 123 229 368 233 334 449 230 420 313 339 218 310 408 391 333 119 217 188 418 360 214 309 227 159 186 331 302 213 111 404 307 417 240 301 356 206 185 327 211 182 124 402 344 205 95 286 396 299 354 203 401 232 181 285 340 122 174 394 353 295 228 179 312 121 216 173 283 118 338 393 448 199 390 332 63 226 158 337 308 117 171 279 389 212 330 225 110 157 184 306 416 115 210 387 329 300 167 271 326 109 204 305 155 209 180 298 325 94 107 400 202 151 284 178 297 352 93 323 294 120 201 172 103 198 177 282 392 91 62 293 143 116 170 281 336 197 61 224 278 388 291 156 87 169 114 195 277 166 108 59 386 328 154 270 113 79 304 55 208 275 385 165 269 324 106 153 150 163 92 105 296 200 149 267 322 176 47 102 90 142 321 292 196 263 147 60 101 280 89 141 168 99 194 290 31 86 85 276 58 139 289 112 193 164 78 57 152 83 274 384 54 135 268 162 77 273 104 53 148 161 266 75 46 100 51 146 265 320 88 262 45 140 71 98 145 43 261 30 84 138 97 29 288 39 259 192 137 82 56 134 76 27 81 52 272 133 160 74 23 50 131 73 44 264 49 70 15 144 42 260 69 28 41 96 67 258 38 26 37 257 132 25 80 22 35 130 21 14 48 129 72 19 13 68 11 40 66 36 7 256 65 24 34 20 33 128 18 12 17 10 9 6 64 5 3 32 16 8 4 2 1 0];

c) $S_{512}^3$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

d) $S_{512}^4$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

e) $S_{512}^5$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

f) $S_{512}^6$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 187 346 236 432 398
357 126 241 207 403 452 345 316 234 397 183 342 125
355 287 424 220 450 233 314 341 395 230 123 368 175
334 449 218 420 313 339 229 310 408 391 333 119 217
188 418 360 214 309 227 159 111 331 302 186 213 404
307 417 206 301 356 185 240 327 211 182 124 402 344
95 205 286 396 299 354 181 401 122 232 285 340 203
174 394 353 295 179 121 312 63 118 173 283 228 338

393 448 199 390 332 216 158 117 337 308 171 226 279
389 110 330 157 212 115 225 306 416 167 109 387 329
300 184 271 326 155 210 305 94 204 107 298 325 209
180 400 151 93 284 202 297 352 103 323 294 178 120
91 62 201 172 282 392 143 198 293 177 61 116 281
336 170 87 197 278 388 291 156 59 114 169 224 277
195 166 108 386 328 79 270 154 113 304 55 165 275
385 106 269 324 153 208 150 92 163 105 296 47 102
267 322 149 90 200 142 101 321 292 176 263 147 89
60 280 31 86 141 196 99 290 58 168 85 276 139 194
289 78 57 112 83 54 193 164 274 384 135 77 268 152
53 273 162 104 75 46 266 148 51 161 45 100 265 320
71 262 146 88 30 140 43 98 261 145 29 84 138 97 288
39 259 56 27 82 137 192 134 76 81 52 272 23 133 74
50 160 131 73 44 264 15 70 49 42 69 260 144 28 41
96 67 38 258 26 136 37 257 25 80 22 132 35 21 130
72 14 48 19 129 13 68 40 11 66 65 36 256 7 24 34 20
33 18 128 12 17 10 9 64 6 5 32 3 16 8 4 2 1 0];

g) $S_{512}^7$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

h) $S_{512}^8$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

i) $S_{512}^9$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

j) $S_{512}^{10}$=[511 510 509 507 503 495 508 479 506 505 502
447 501 494 499 493 383 478 491 477 504 487 475 446

255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

k) $S_{512}^1$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162

77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

l) $S_{512}^2$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 59 169 224 277
195 166 108 386 328 79 270 154 113 304 55 165 275
385 106 269 324 153 208 150 92 163 47 296 105 102
267 322 149 90 200 142 101 321 292 176 263 147 89
99 280 60 31 141 196 86 290 58 168 85 276 139 194
289 78 112 57 83 54 193 164 274 384 135 77 268 152
104 273 162 53 75 46 266 148 100 161 51 88 265 320
45 262 146 71 98 140 30 43 261 145 84 29 138 97 288
56 259 137 82 39 134 27 76 81 133 52 272 74 23 192
50 73 44 70 131 264 15 49 160 42 69 260 28 96 41 144
67 38 258 26 80 257 136 25 22 35 72 132 21 14 48
130 68 19 129 13 66 11 40 7 36 256 24 65 34 20 33 18
12 17 128 10 9 64 6 5 3 32 16 8 4 2 1 0];

m) $S_{512}^3$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329

300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

n) $S_{512}^4$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

o) $S_{512}^5$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398

Figure 3:
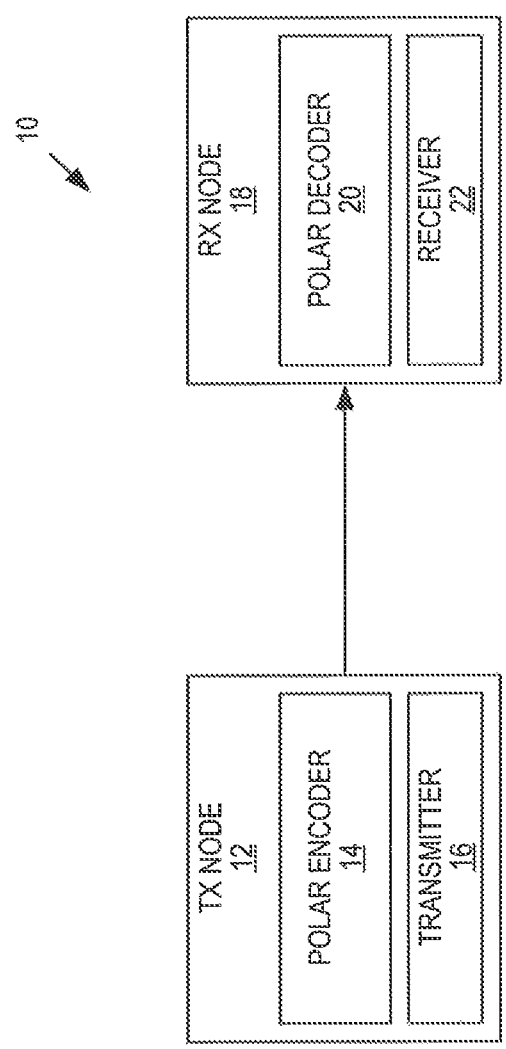
FIG. 3 illustrates one example of a system in which embodiments of the present disclosure may be implemented.

357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

FIG. 3 illustrates a wireless communications system 10 including a transmit (TX) node 12 that includes a polar encoder 14 (i.e., a polar code encoder) and a transmitter 16, and a receive (RX) node 18 that includes a polar decoder 20 (i.e., a polar code decoder) and a receiver 22. The polar encoder 14 may be implemented in hardware or a combination of hardware and software (e.g., software stored on memory and executed by a processor(s)). The transmitter 16 includes various hardware components such as, e.g., Digital-to-Analog Converter(s) (DAC(s)), filter(s), mixer(s), amplifier(s), and/or the like. Likewise, the polar decoder 20 may be implemented in hardware or a combination of hardware and software (e.g., software stored on memory and executed by a processor(s)). The receiver 22 includes various hardware components such as, e.g., an Analog-to-Digital Converter(s) (ADC(s)), filter(s), mixer(s), amplifier(s), and/or the like. The wireless communications system 10 may be any type of wireless communications system such as, but not limited to, a cellular communications network in which the transmit node 12 is, e.g., a radio access node (e.g., a base station) and the receive node 18 is a wireless device or terminal (e.g., a UE), or vice versa.

Figure 4A:
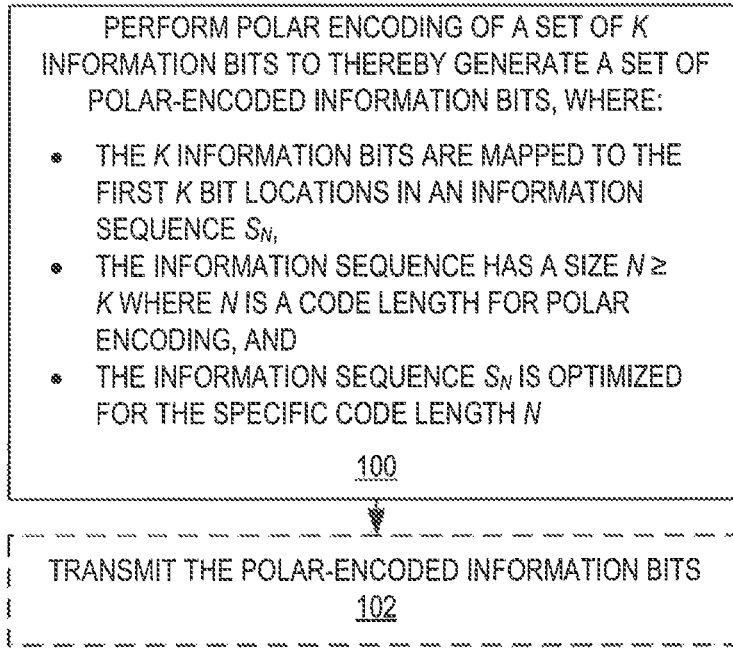
FIG. 4A is a flow chart that illustrates the operation of a transmit node in accordance with some embodiments of the present disclosure.

FIG. 4A is a flow chart that illustrates the operation of the transmit node 12 in accordance with some embodiments of the present disclosure. Optional steps are represented by a dashed box. As illustrated, the transmit node 12, and in particular the polar encoder 14, performs polar encoding of a set of K information bits to thereby generate a set of polar-encoded information bits (step 100). For polar encoding, there is a set of input bit locations for the polar encoder 14 consisting of N information bit (i.e., not frozen bit) locations and one or more non-information (i.e., frozen) bit locations, where N is the code length and N≥K. The N information bit locations are referred to as an information set. An information sequence SN (i.e., a ranking sequence of the information bit locations) is optimized for the specific code length N. The K information bits are mapped to the first K bit locations in the information sequence SN.

In some embodiments, N=512 and the information sequences SN are:

a) $S_{512}^1$=[511 510 509 507 503 495 508 479 506 505 502
447 501 494 499 493 383 478 491 477 504 487 475 446

255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 187 346 236 432 398
357 126 241 207 403 452 345 316 234 397 183 342 125
355 287 424 220 450 233 314 341 395 230 123 368 175
334 449 218 420 313 339 229 310 408 391 333 119 217
188 418 360 214 309 227 159 111 331 302 186 213 404
307 417 206 301 356 185 240 327 211 182 124 402 344
95 205 286 396 299 354 181 401 122 232 285 340 203
174 394 353 295 179 121 312 63 118 173 283 228 338
393 448 199 390 332 216 158 117 337 308 171 226 279
389 110 330 157 212 115 225 306 416 167 109 387 329
300 184 271 326 155 210 305 94 204 107 298 325 209
180 400 151 93 284 202 297 352 103 323 294 178 120
91 62 201 172 282 392 143 198 293 177 61 116 281
336 170 87 197 278 388 291 156 59 114 169 224 277
195 166 108 386 328 79 270 154 113 304 55 165 275
385 106 269 324 153 208 150 92 163 105 296 47 102
267 322 149 90 200 142 101 321 292 176 263 147 89
60 280 31 86 141 196 99 290 58 168 85 276 139 194
289 78 57 112 83 54 193 164 274 384 135 77 268 152
53 273 162 104 75 46 266 148 51 161 45 100 265 320
71 262 146 88 30 140 43 98 261 145 29 84 138 97 288
39 259 56 27 82 137 192 134 76 81 52 272 23 133 74
50 160 131 73 44 264 15 70 49 42 69 260 144 28 41
96 67 38 258 26 136 37 257 25 80 22 132 35 21 130
72 14 48 19 129 13 68 40 11 66 65 36 256 7 24 34 20
33 18 128 12 17 10 9 64 6 5 32 3 16 8 4 2 1 0];

b) $S_{512}^2$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

c) $S_{512}^3$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

d) $S_{512}^4$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329

300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

e) $S_{512}^5$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

f) $S_{512}^6$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 187 346 236 432 398
357 126 241 207 403 452 345 316 234 397 183 342 125
355 287 424 220 450 233 314 341 395 230 123 368 175
334 449 218 420 313 339 229 310 408 391 333 119 217
188 418 360 214 309 227 159 111 331 302 186 213 404
307 417 206 301 356 185 240 327 211 182 124 402 344
95 205 286 396 299 354 181 401 122 232 285 340 203
174 394 353 295 179 121 312 63 118 173 283 228 338
393 448 199 390 332 216 158 117 337 308 171 226 279
389 110 330 157 212 115 225 306 416 167 109 387 329
300 184 271 326 155 210 305 94 204 107 298 325 209
180 400 151 93 284 202 297 352 103 323 294 178 120
91 62 201 172 282 392 143 198 293 177 61 116 281
336 170 87 197 278 388 291 156 59 114 169 224 277
195 166 108 386 328 79 270 154 113 304 55 165 275
385 106 269 324 153 208 150 92 163 105 296 47 102
267 322 149 90 200 142 101 321 292 176 263 147 89
60 280 31 86 141 196 99 290 58 168 85 276 139 194
289 78 57 112 83 54 193 164 274 384 135 77 268 152
53 273 162 104 75 46 266 148 51 161 45 100 265 320
71 262 146 88 30 140 43 98 261 145 29 84 138 97 288
39 259 56 27 82 137 192 134 76 81 52 272 23 133 74
50 160 131 73 44 264 15 70 49 42 69 260 144 28 41
96 67 38 258 26 136 37 257 25 80 22 132 35 21 130
72 14 48 19 129 13 68 40 11 66 65 36 256 7 24 34 20
33 18 128 12 17 10 9 64 6 5 32 3 16 8 4 2 1 0];

g) $S_{512}^7$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 6 5 3 32 16 8 4 2 1 0];

h) $S_{512}^8$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253

483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

i) $S_{512}^{9}$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

j) $S_{512}^{10}$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 246 191 350 465
436 363 245 458 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

k) $S_{512}^{1}$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201

172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

l) $S_{512}^2$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 59 169 224 277
195 166 108 386 328 79 270 154 113 304 55 165 275
385 106 269 324 153 208 150 92 163 47 296 105 102
267 322 149 90 200 142 101 321 292 176 263 147 89
99 280 60 31 141 196 86 290 58 168 85 276 139 194
289 78 112 57 83 54 193 164 274 384 135 77 268 152
104 273 162 53 75 46 266 148 100 161 51 88 265 320
45 262 146 71 98 140 30 43 261 145 84 29 138 97 288
56 259 137 82 39 134 27 76 81 133 52 272 74 23 192
50 73 44 70 131 264 15 49 160 42 69 260 28 96 41 144
67 38 258 26 80 37 257 136 25 22 35 72 132 21 14 48
130 68 19 129 13 66 11 40 7 36 256 24 65 34 20 33 18
12 17 128 10 9 64 6 5 3 32 16 8 4 2 1 0];

m) $S_{512}^3$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

n) $S_{512}^4$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0];

o) $S_{512}^5$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 484 435 377 429 374

472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 412 343
451 317 235 364 422 221 315 370 425 410 335 480 248
231 421 369 311 219 348 190 406 419 464 362 303 358
409 244 189 346 405 215 456 242 126 361 187 432 398
357 236 241 207 403 452 345 316 175 397 234 342 125
355 287 424 220 450 183 314 341 395 123 229 368 233
334 449 230 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 110 330 157 212 115 225 306 416 167 109 387 329
300 184 271 326 155 210 305 94 204 107 298 325 209
180 400 151 93 284 202 297 352 120 323 294 178 103
91 62 201 172 282 392 143 198 293 177 116 61 281
336 170 87 197 278 388 291 156 114 108 169 224 277
195 166 59 386 328 113 270 154 79 304 55 165 275
385 106 269 324 153 208 150 92 163 105 296 47 102
267 322 149 90 200 142 31 321 292 176 263 147 101
89 280 99 60 141 196 86 290 85 168 58 276 139 194
289 112 78 57 83 54 193 164 274 384 135 77 268 152
104 273 162 53 75 46 266 148 100 161 51 88 265 320
45 262 146 71 98 140 30 43 261 145 84 97 138 29 288
56 259 82 39 76 137 192 134 27 81 52 272 74 133 23
50 73 44 15 131 264 70 49 160 42 69 260 28 41 96 144
67 38 258 26 37 25 257 136 80 22 35 21 132 14 19 72
130 13 48 129 68 11 40 66 7 36 256 65 24 34 20 33 18
12 17 128 10 9 6 64 5 3 32 16 8 4 2 1 0];

Optionally, the transmit node 12, and more specifically the transmitter 16, transmits the polar-encoded information bits (step 102). Notably, other optional steps (e.g., rate-matching) may be performed after polar encoding and prior to transmission.

Figure 4B:
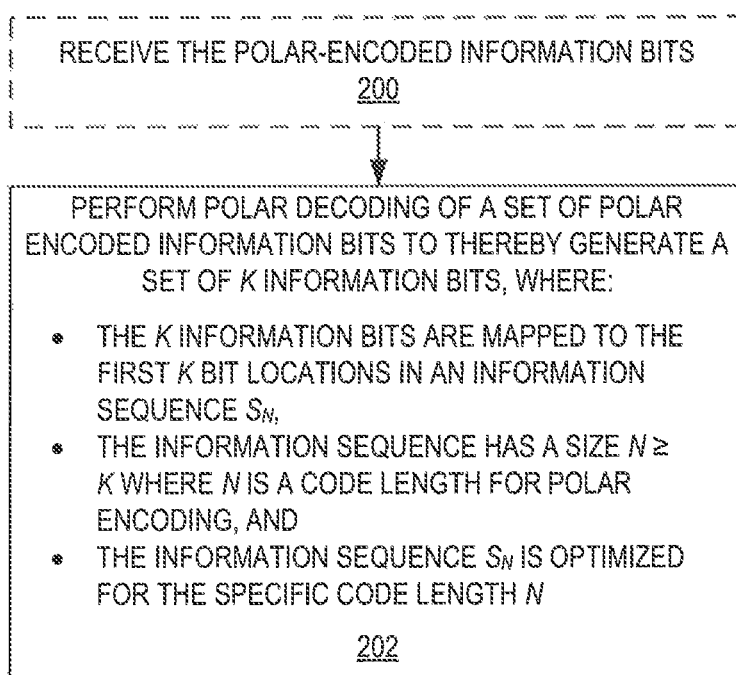
FIG. 4B is a flow chart that illustrates the operation of a receive node in accordance with some embodiments of the present disclosure.

FIG. 4B is a flow chart that illustrates the operation of the receive node 18 in accordance with some embodiments of the present disclosure. Optional steps are represented by a dashed box. As illustrated, the receive node 18, and in particular the polar decoder 20, performs polar decoding of a set of polar encoded information bits to thereby generate a set of K information bits (step 202). The polar encoded bits may have been generated according to step 100 described with respect to FIG. 4A.

Optionally, the receive node 18, and more specifically the receiver 22, receives the polar-encoded information bits (step 200). Notably, other optional steps may be performed after receiving and before polar decoding.

Figure 5:
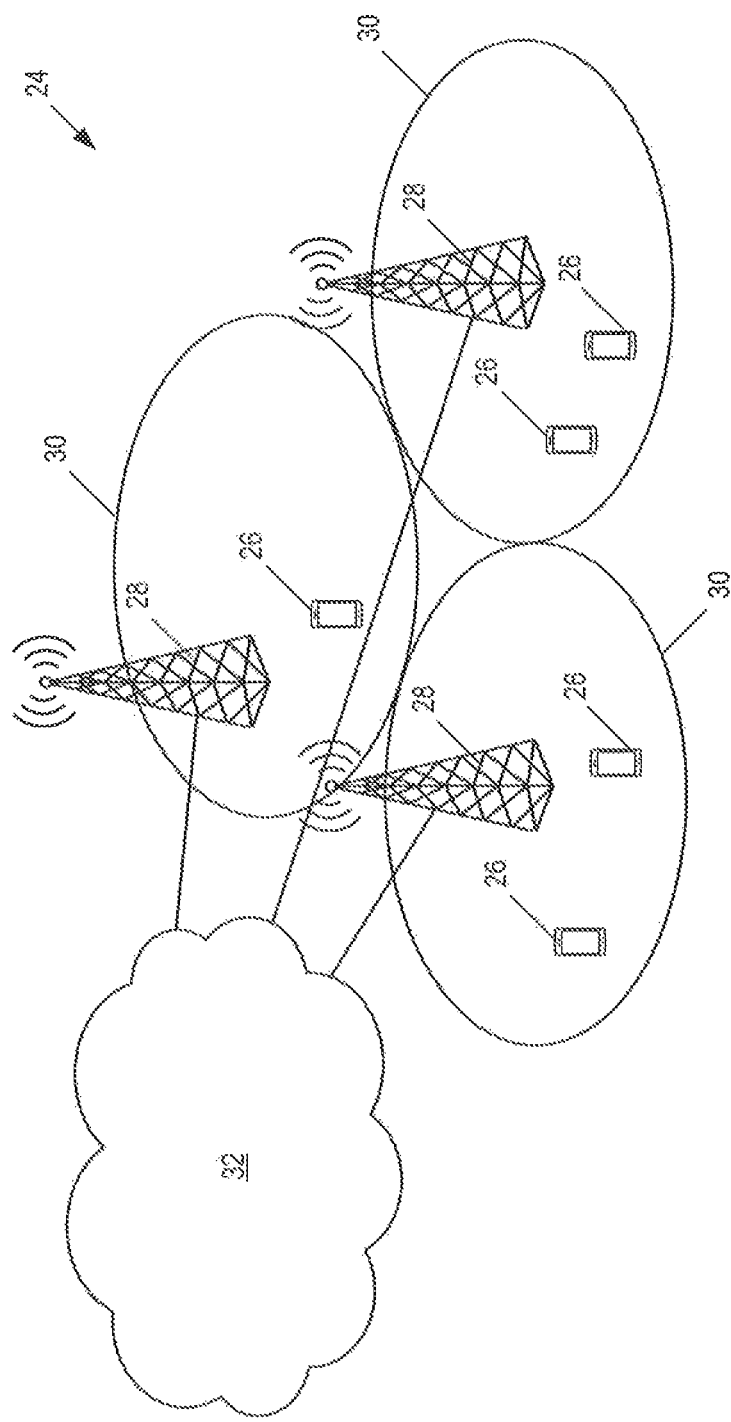
FIG. 5 illustrates one example of a wireless communication system in which embodiments of the present disclosure may be implemented.

FIG. 5 illustrates one example of a wireless communication system 24 in which embodiments of the present disclosure may be implemented. The wireless communication system 24 is preferably a 3GPP 5G NR system, but is not limited thereto. As illustrated, the wireless communication system 24 includes a number of wireless communication devices 26, which are also referred to herein as UEs. In addition, the wireless communication system 24 includes a radio access network that includes a number of radio access nodes 28 (e.g., gNBs) serving corresponding coverage areas or cells 30. The radio access nodes 28 are connected to a core network 32, which includes a number of core network nodes, as will be appreciated by one of skill in the art.

As an example, the radio access node 28 and/or the wireless communication device 26 may operate as the transmit node 12 described above.

Figure 6:
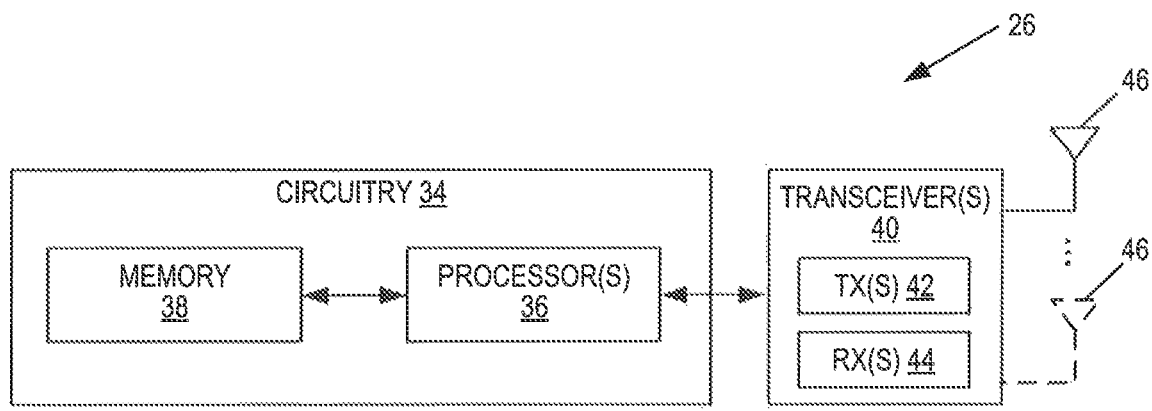
FIGS. 6 and 7 illustrate example embodiments of a wireless communication device.

FIG. 6 is a schematic block diagram of the wireless communication device 26, or UE, according to some embodiments of the present disclosure. As illustrated, the wireless communication device 26 includes circuitry 34 comprising one or more processors 36 (e.g., Central Processing Units (CPUs), Application Specific Integrated Circuits (ASICs), Field Programmable Gate Arrays (FPGAs), Digital Signal Processors (DSPs), and/or the like) and memory 38. The wireless communication device 26 also includes one or more transceivers 40 each including one or more transmitters 42 and one or more receivers 44 coupled to one or more antennas 46. In some embodiments, the functionality of the wireless communication device 26 described herein may be implemented in hardware (e.g., via hardware within the circuitry 34 and/or within the processor(s) 36) or be implemented in a combination of hardware and software (e.g., fully or partially implemented in software that is, e.g., stored in the memory 38 and executed by the processor(s) 36).

In some embodiments, a computer program including instructions which, when executed by the at least one processor 36, causes the at least one processor 36 to carry out at least some of the functionality of the wireless communication device 26 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 7:
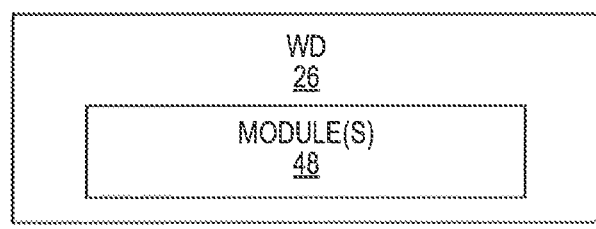

FIG. 7 is a schematic block diagram of the wireless communication device 26, or UE, according to some other embodiments of the present disclosure. The wireless communication device 26 includes one or more modules 48, each of which is implemented in software. The module(s) 48 provide the functionality of the wireless communication device 26, or more specifically the transmit node 12, described herein (e.g., as described with respect to FIGS. 3 and 4).

Figure 8:
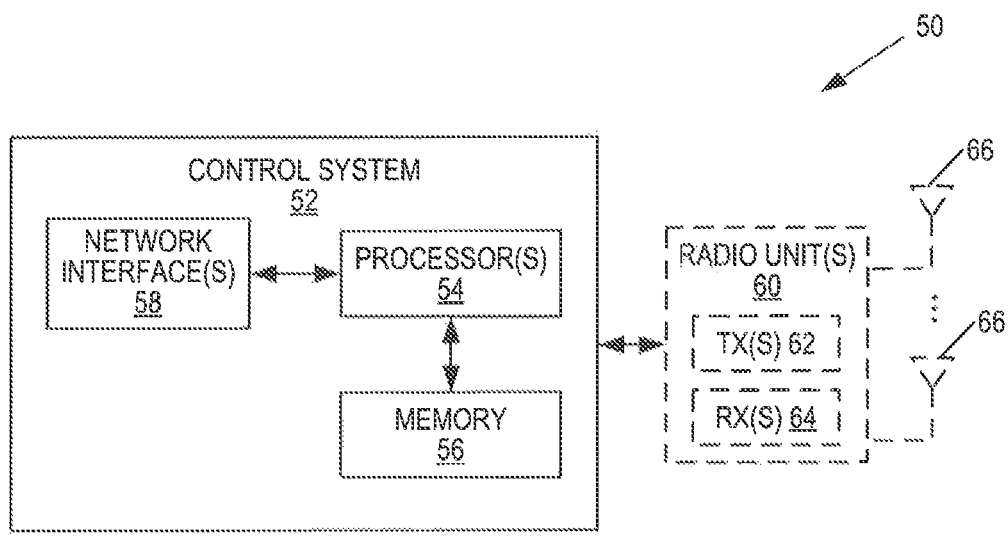
FIGS. 8 through 10 illustrate example embodiments of a network node.

FIG. 8 is a schematic block diagram of a network node 50 (e.g., a radio access node 28 such as, for example, a gNB) according to some embodiments of the present disclosure. As illustrated, the network node 50 includes a control system 52 that includes circuitry comprising one or more processors 54 (e.g., CPUs, ASICs, DSPs, FPGAs, and/or the like) and memory 56. The control system 52 also includes a network interface 58. In embodiments in which the network node 50 is a radio access node 28, the network node 50 also includes one or more radio units 60 that each include one or more transmitters 62 and one or more receivers 64 coupled to one or more antennas 66. In some embodiments, the functionality of the network node 50 (specifically the functionality of the radio access node 28 or transmit node 12) described above may be fully or partially implemented in software that is, e.g., stored in the memory 56 and executed by the processor(s) 54.

Figure 9:
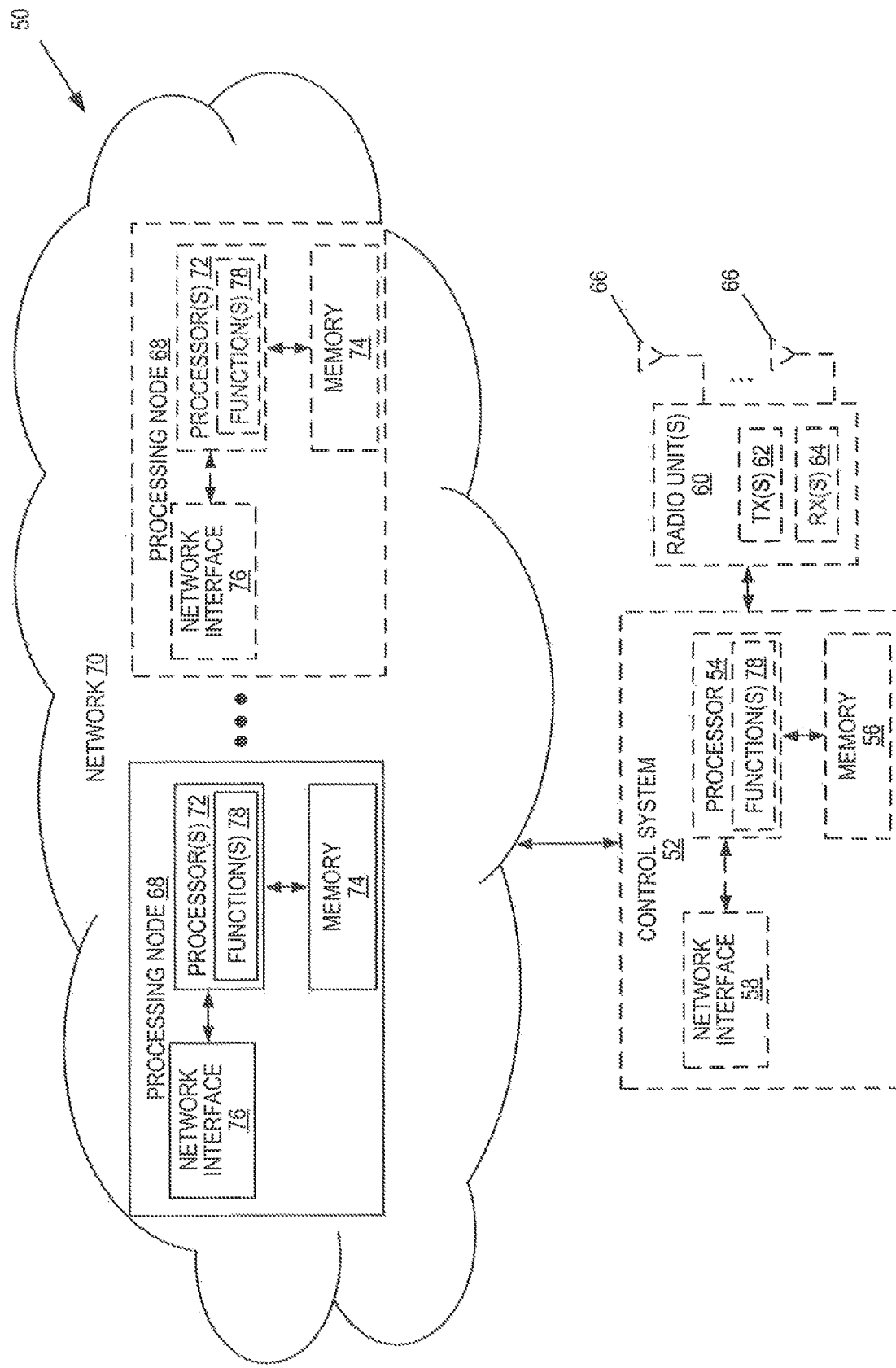

FIG. 9 is a schematic block diagram that illustrates a virtualized embodiment of the network node 50 (e.g., the radio access node 28) according to some embodiments of the present disclosure. As used herein, a "virtualized" network node 50 is a network node 50 in which at least a portion of the functionality of the network node 50 is implemented as a virtual component (e.g., via a virtual machine(s) executing on a physical processing node(s) in a network(s)). As illustrated, the network node 50 optionally includes the control system 52, as described with respect to FIG. 8. In addition, if the network node 50 is the radio access node 28, the network node 50 also includes the one or more radio units 60, as described with respect to FIG. 8. The control system 52 (if present) is connected to one or more processing nodes 68 coupled to or included as part of a network(s) 70 via the network interface 58. Alternatively, if the control system 52 is not present, the one or more radio units 60 (if present) are connected to the one or more processing nodes 68 via a network interface(s). Alternatively, all of the functionality of the network node 50 (e.g., all of the functionality of the radio access node 28) described herein may be implemented in the processing nodes 68. Each processing node 68 includes one or more processors 72 (e.g., CPUs, ASICs, DSPs, FPGAs, and/or the like), memory 74, and a network interface 76.

In this example, functions 78 of the network node 50 (e.g., the functions of the radio access node 28 or transmit node 12) described herein are implemented at the one or more processing nodes 70 or distributed across the control system 52 (if present) and the one or more processing nodes 68 in any desired manner. In some particular embodiments, some or all of the functions 78 of the network node 50 described herein are implemented as virtual components executed by one or more virtual machines implemented in a virtual environment(s) hosted by the processing node(s) 68. As will be appreciated by one of ordinary skill in the art, additional signaling or communication between the processing node(s) 68 and the control system 52 (if present) or alternatively the radio unit(s) 60 (if present) is used in order to carry out at least some of the desired functions. Notably, in some embodiments, the control system 52 may not be included, in which case the radio unit(s) 60 (if present) communicates directly with the processing node(s) 68 via an appropriate network interface (s).

In some particular embodiments, higher layer functionality (e.g., layer 3 and up and possibly some of layer 2 of the protocol stack) of the network node 50 may be implemented at the processing node(s) 68 as virtual components (i.e., implemented "in the cloud") whereas lower layer functionality (e.g., layer 1 and possibly some of layer 2 of the protocol stack) may be implemented in the radio unit(s) 60 and possibly the control system 52.

In some embodiments, a computer program including instructions which, when executed by the at least one processor 54, 72, causes the at least one processor 54, 72 to carry out the functionality of the network node 50 or a processing node 68 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 56, 74).

Figure 10:
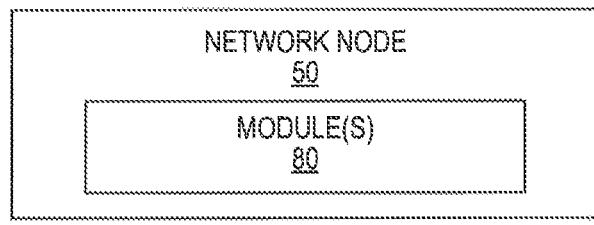

FIG. 10 is a schematic block diagram of the network node 50 (e.g., the radio access node 28) according to some other embodiments of the present disclosure. The network node 50 includes one or more modules 80, each of which is implemented in software. The module(s) 80 provide the functionality of the network node 50 described herein (e.g., the functionality of the transmit node 12 as described herein, e.g., with respect to FIGS. 3 and 4).

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure.

Abbreviations Used in the Preceding Description Include

3GPP Third Generation Partnership Project
5G Fifth Generation
ADC Analog-to-Digital Converter
ASIC Application Specific Integrated Circuit
AWGN Additive White Gaussian Noise
BLER Block Error Rate
CPU Central Processing Unit
CRC Cyclic Redundancy Check
DAC Digital-to-Analog Converter
DSP Digital Signal Processor
eNB Enhanced or Evolved Node B
FPGA Field Programmable Gate Array
gNB New Radio Base Station
LDPC Low-Density Parity-Check
LTE Long Term Evolution
ML Maximum-Likelihood
MME Mobility Management Entity
MTC Machine Type Communication
NR New Radio
P-GW Packet Data Network Gateway
PW Polarization Weight
RX Receive
SC Successive Cancellation
SCEF Service Capability Exposure Function
SCL Successive Cancellation List
TX Transmit
UE User Equipment

The invention claimed is:

1. A method of operation of a transmit node in a wireless communication system, the method comprising:
  performing polar encoding of a set of K information bits to thereby generate a set of polar-encoded information bits wherein:
  the K information bits are mapped to first K bit locations in an information sequence $S_N$, the information sequence $S_N$ being a ranked sequence of N information bit locations among a plurality of input bits for the polar encoding where N is equivalent to a code length;
  a size of the information sequence $S_N$ is greater than or equal to K; and
  the information sequence $S_N$ is optimized for a specific value of the code length (N);
  wherein N=512, and the information sequence $S_N$ is:
  $S_{512}^1$=[511 510 509 507 503 495 508 479 506 505 502 447 501 494 499 493 383 478 491 477 504 487 475 446 255 500 445 471 498 443 492 382 497 463 490 439 381 476 489 486 379 431 474 485 254 375 473 444 470 253

483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 187 346 236 432 398
357 126 241 207 403 452 345 316 234 397 183 342 125
355 287 424 220 450 233 314 341 395 230 123 368 175
334 449 218 420 313 339 229 310 408 391 333 119 217
188 418 360 214 309 227 159 111 331 302 186 213 404
307 417 206 301 356 185 240 327 211 182 124 402 344
95 205 286 396 299 354 181 401 122 232 285 340 203
174 394 353 295 179 121 312 63 118 173 283 228 338
393 448 199 390 332 216 158 117 337 308 171 226 279
389 110 330 157 212 115 225 306 416 167 109 387 329
300 184 271 326 155 210 305 94 204 107 298 325 209
180 400 151 93 284 202 297 352 103 323 294 178 120
91 62 201 172 282 392 143 198 293 177 61 116 281
336 170 87 197 278 388 291 156 59 114 169 224 277
195 166 108 386 328 79 270 154 113 304 55 165 275
385 106 269 324 153 208 150 92 163 105 296 47 102
267 322 149 90 200 142 101 321 292 176 263 147 89
60 280 31 86 141 196 99 290 58 168 85 276 139 194
289 78 57 112 83 54 193 164 274 384 135 77 268 152
53 273 162 104 75 46 266 148 51 161 45 100 265 320
71 262 146 88 30 140 43 98 261 145 29 84 138 97 288
39 259 56 27 82 137 192 134 76 81 52 272 23 133 74
50 160 131 73 44 264 15 70 49 42 69 260 144 28 41
96 67 38 258 26 136 37 257 25 80 22 132 35 21 130
72 14 48 19 129 13 68 40 11 66 65 36 256 7 24 34 20
33 18 128 12 17 10 9 64 6 5 32 3 16 8 4 2 1 0].

2. A method of operation of a transmit node in a wireless communication system, the method comprising:
   performing polar encoding of a set of K information bits to thereby generate a set of polar-encoded information bits wherein:
   the K information bits are mapped to first K bit locations in an information sequence $S_N$, the information sequence $S_N$ being a ranked sequence of N information bit locations among a plurality of input bits for the polar encoding where N is equivalent to a code length;
   a size of the information sequence $S_N$ is greater than or equal to K; and
   the information sequence $S_N$ is optimized for a specific value of the code length (N);
   method wherein N=512, and the information sequence $S_N$ is:
   $S_{512}^2$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139
289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0].

3. A method of operation of a transmit node in a wireless communication system, the method comprising:
   performing polar encoding of a set of K information bits to thereby generate a set of polar-encoded information bits wherein:
   the K information bits are mapped to first K bit locations in an information sequence $S_N$, the information sequence $S_N$ being a ranked sequence of N information bit locations among a plurality of input bits for the polar encoding where N is equivalent to a code length;
   a size of the information sequence $S_N$ is greater than or equal to K; and
   the information sequence $S_N$ is optimized for a specific value of the code length (N);
   method wherein N=512, and the information sequence $S_N$ is:
   $S_{512}^3$=[511 510 509 507 503 495 508 479 506 505 502
447 501 494 499 493 383 478 491 477 504 487 475 446
255 500 445 471 498 443 492 382 497 463 490 439 381
476 489 486 379 431 474 485 254 375 473 444 470 253
483 415 442 469 367 251 496 462 441 467 438 380 461
247 351 488 437 378 459 430 239 435 484 377 429 374
472 455 319 252 482 414 373 427 223 468 366 481 250
413 371 440 423 365 466 249 411 460 465 246 436 350
363 458 191 245 407 349 238 434 376 359 457 243 428
454 347 237 318 433 399 127 372 426 453 222 317 235
343 480 412 425 370 221 451 422 315 364 248 231 410
369 335 219 421 190 464 362 311 409 244 406 189 348
419 361 215 358 456 242 405 303 126 346 187 432 398
357 236 241 207 403 452 345 316 183 397 234 342 125
355 287 424 220 450 175 314 341 395 123 230 368 233
334 449 229 420 313 339 218 310 408 391 333 119 217
188 418 360 214 309 227 159 186 331 302 213 111 404
307 417 240 301 356 206 185 327 211 182 124 402 344
205 95 286 396 299 354 203 401 232 181 285 340 122
174 394 353 295 228 179 312 121 216 173 283 118 338
393 448 199 390 332 63 226 158 337 308 117 171 279
389 212 330 225 110 157 184 306 416 115 210 387 329
300 167 271 326 109 204 305 155 209 180 298 325 94
107 400 202 151 284 178 297 352 93 323 294 120 201
172 103 198 177 282 392 91 62 293 143 116 170 281
336 197 61 224 278 388 291 156 87 169 114 195 277
166 108 59 386 328 154 270 113 79 304 55 208 275
385 165 269 324 106 153 150 163 92 105 296 200 149
267 322 176 47 102 90 142 321 292 196 263 147 60
101 280 89 141 168 99 194 290 31 86 85 276 58 139

289 112 193 164 78 57 152 83 274 384 54 135 268 162
77 273 104 53 148 161 266 75 46 100 51 146 265 320
88 262 45 140 71 98 145 43 261 30 84 138 97 29 288
39 259 192 137 82 56 134 76 27 81 52 272 133 160 74
23 50 131 73 44 264 49 70 15 144 42 260 69 28 41 96
136 67 258 38 26 37 257 132 25 80 22 35 130 21 14
48 129 72 19 13 68 11 40 66 36 7 256 65 24 34 20 33
128 18 12 17 10 9 6 64 5 3 32 16 8 4 2 1 0].

4. The method of claim 1, wherein the transmit node is a radio access node in a wireless communication system.

5. The method of claim 1, wherein the transmit node is a wireless communication device in a wireless communication system.

\* \* \* \* \*